July 21, 1964 G. MORDWINKIN 3,142,024
DUAL FREQUENCY UNIJUNCTION TRANSISTOR OSCILLATOR
Filed Feb. 20, 1962
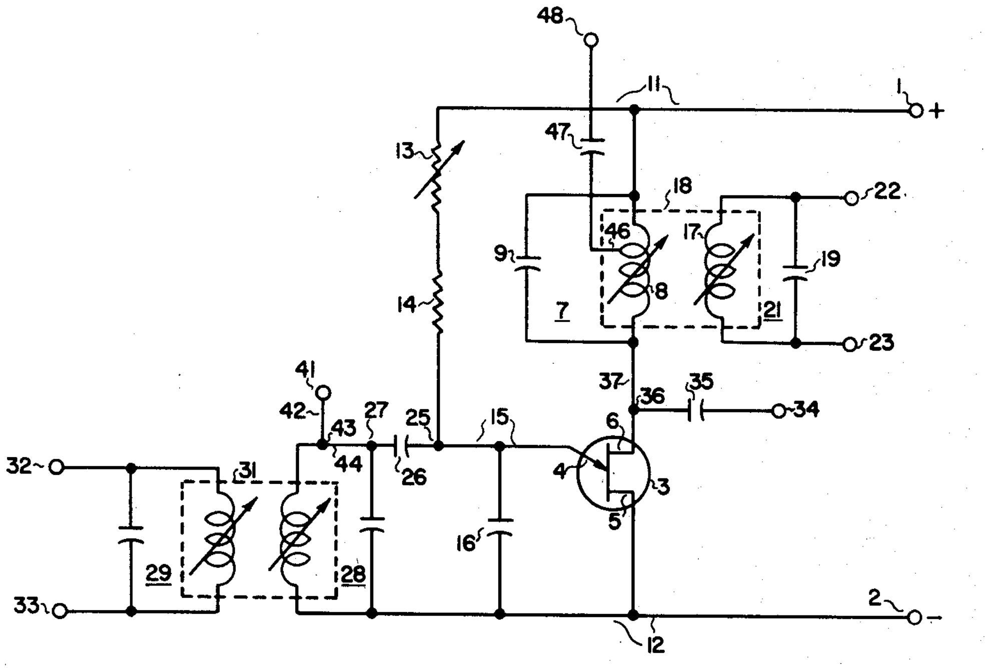
INVENTOR.
GEORGE MORDWINKIN
BY Edward W. Eames
ATTORNEY United States Patent Office 3,142,024
Patented July 21, 1964

3,142,024
DUAL FREQUENCY UNIJUNCTION TRANSISTOR OSCILLATOR

George Mordwinkin, Norwalk, Conn., assignor to Laboratory for Electronics, Inc., Boston, Mass., a corporation of Delaware Filed Feb. 20, 1962, Ser. No. 174,509
10 Claims. (Cl. 331—60)

The present invention relates to an oscillator and more particularly relates to a transistor oscillator employing a unijunction transistor with one or more inductance-capacitance resonant circuits and related circuitry for providing a substantially sine wave output at one desired frequency in one aspect and for providing outputs at two related frequencies, with the second frequency being a multiple or harmonic of the first, in another aspect.

In its preferred aspect of providing two outputs at such related frequencies the oscillator circuit according to the invention provides a low cost and greatly simplified source of two stable related frequencies which may be used in multiplexing systems for example, and is particularly advantageous as a source of frequencies of 19 kilocycles per second and 38 kilocycles per second, such as may serve as sub-carriers in frequency modulation (F–M) stereo multiplex systems and adapters for converting F–M receivers to F–M stereo receivers, although it will be understood that the invention is not limited to such applications.

Oscillator-frequency multiplier circuits of this character may also be employed as a source of plural subcarrier frequencies in other forms of remote control systems such as for traffic signal control for example.

It is also often desirable in such systems to synchronize a frequency or frequencies with an external reference frequency which may be the same as the desired frequency or a harmonic of it.

Oscillator circuits with which I am familiar in the prior art employ electronic tube circuits requiring substantial power supplies and considerable space and generate a considerable amount of heat, all of which are distinct disadvantages in the design of equipment of compact, reliable and low cost characteristics.

Furthermore electronic tube circuits are apt to have a relatively short life and to be quite sensitive to shock or vibration.

Although transistor circuits with which I am familiar have overcome some of these disadvantages, such transistor circuits with which I am familiar in the prior art for generating stable substantially sine wave oscillations and particularly for providing outputs of harmonically related frequencies appear quite complex.

The present invention overcomes these and other disadvantages of the prior art and provides a circuit of greatly simplified and compact form employing a novel construction combining a single unijunction transistor and a resistance-capacitance circuit with one or more parallel resonant inductance-capacitance (LC) circuits or tank circuits which provide the one or more frequencies desired. As a further aspect the present circuit in its preferred form also provides for external synchronization.

It is therefore an object of the present invention to provide an improved transistor oscillator for generating harmonically related frequencies.

It is also an object of the invention to provide an improved transistor oscillator for generating one or more frequencies.

It is a further object of the invention to provide an oscillator circuit employing a unijunction transistor in combination with a resistance-capacitance circuit and one or more inductance-capacitance resonant circuits for generating one or more frequencies, with the frequencies harmonically related when plural.

Other objects may appear from the following description and appended claims, and in reference to the accompanying figure of drawing comprising a schematic representation of preferred embodiment of the invention.

Referring to the single figure of the drawing, terminal 1 marked with a plus sign (+) and terminal 2 marked with a minus sign (−) represent the positive and negative ends of a direct current low voltage supply respectively, or positive and negative terminals respectively for connection to such voltage supply, which may be from a battery or rectified and filtered alternating current.

The unijunction transistor 3 has an emitter 4, a first base 5 and a second base 6, which are sometimes referred to as base #1 and base #2 respectively. An LC parallel resonant circuit or tank circuit 7, comprising inductance 8 and capacitor 9 in parallel, is connected between positive line 11 and the second base 6 of the transistor. The first base 5 of the transistor is connected to the negative or return line 12. Line 11 is connected with the positive terminal 1 and line 12 is connected with the negative terminal 2.

Either inductance 8 or capacitor 9 is adjustable for tuning the LC circuit for the desired frequency output, the inductance being shown adjustable in the preferred circuit. An adjustable resistance 13 is connected in series with a fixed resistance 14 between the positive line 11 and lead 15 connected with the emitter 4, and a capacitor 16 is connected between return line 12 and emitter 4 via lead 15.

In the preferred form of the circuit a second inductance 17 is coupled to inductance 8, as in an intermediate frequency transformer arrangement for example. The coupling of these inductances 8 and 17 is indicated by the broken line box 18. The inductance 17 and its associated capacitor 19 form another parallel resonant or tank circuit 21 tuned to the same frequency as that of the tank circuit 7. Output terminals 22 and 23 are connected to the upper and lower ends of the capacitor 19 and thus of the tank circuit 21.

One desired frequency, which may be considered the fundamental frequency, for example, is obtained between terminals 22 and 23 when the tank circuits 7 and 21 are tuned to this frequency and the resistance 13 is adjusted to cause the transistor 3 to oscillate or pulsate at this frequency as more fully explained below.

According to a preferred aspect of the invention, where a second frequency is also desired as a multiple or harmonic of the first frequency, the additional circuitry at the left of the junction 25 on line 15 is provided, including the direct current (D.C.) blocking capacitor 26 as a coupling capacitor connected between junctions 25 and 27, and the tank circuit 28 connected between junction 27 and the return line 12, the tank circuit including at least one adjustable element for tuning it to the desired harmonic of the fundamental frequency. The corresponding tank circuit 29 is similarly tuned and coupled to tank circuit 28 as indicated by the broken line 31, each of the tank circuits having their own individual tuning adjustment. The terminals 32 and 33, connected to the upper and lower ends of the tank circuit 29, serve as output terminals for the harmonic frequency, which may be twice the fundamental or three times the fundamental or other multiple as desired.

Although the preferred form of the circuit provides a second tank circuit coupled to the first to provide an isolated output at terminals 22 and 23 of one frequency as the fundamental frequency, for example, if it is not desired to isolate the output, an alternate form of output may be employed to provide the same first or fundamental frequency between terminal 34 and the return line 12 or terminal 2, the terminal 34 being coupled by a D.C. blocking capacitor 35 to junction 36 on line 37 connected between the second base 6 and tank circuit 7. The preferred circuit provides double or closer tuning to provide improved wave form particularly under load conditions.

Similarly, if a second frequency is desired without isolating its output, the tank circuit 29 may be omitted and the second frequency output be taken between terminal 41 and the return line 12 or terminal 2. The terminal 41 is connected via lead 42 and junction 43 to line 44, which is at the upper end of the tank circuit 28.

Considering now the operation of the circuit, if it is assumed at first that all the tank circuits are removed and the tank circuit 7 replaced by a resistance, for example, then the unijunction transistor 3 will provide a rectangular wave output at its second base 6 and on line 37 with reference to base 5 and line 12, or with reference to line 11. In any event a sawtooth wave will appear at emitter 4 and on line 15 with reference to base 5 and return line 12. Both of such waves will be at the same frequency or repetition rate depending upon the characteristic of the unijunction transistor and the RC circuit 13–14 and 16, the transistor having a period of substantial non-conduction between the emitter 4 and base 5 while capacitor 16 is being charged until the resulting rising voltage on the emitter reaches the voltage between the emitter 4 and the first base 5 caused by the voltage divider effect of the voltage gradient between base 6 and base 5 when the transistor is in its substantially non-conducting state for emitter to base 5 junction. This voltage gradient is derived from relatively low current between base 6 and base 5. However, when the voltage on capacitor 16 reaches the voltage between emitter 4 and base 5, then the emitter to base 5 circuit becomes heavily conducting, which also causes a large decrease in the voltage difference between base 5 and base 6. The emitter to base 5 conduction discharges capacitor 16 rapidly and the transistor returns to its substantially non-conducting condition at a point at which capacitor 16 is discharged to a low level and, with the return to the substantially non-conducting condition, the charging of capacitor 16 resumes and the cycle is repeated.

As mentioned above, this results in triangular or sawtooth waves between emitter and return line and would result in somewhat rectangular waves between base 6 and the return line 12, without the LC circuit. However, the introduction of the tank circuit 7 causes the wave form to become substantially sine wave, for the desired outputs between terminals 34 and 2 or between terminals 22 and 23. Similarly the introduction of the tank circuit 28 provides substantially a sine wave at output terminals 32–33 or between terminals 41 and 2, from the wave forms appearing between emitter 4 and base 5, and the characteristic being such as to provide a readily available harmonic frequency through the novel circuitry.

The adjustment of resistance 13 may be employed to vary the wave form of the fundamental frequency and adjust its phase relation to the harmonic frequency when the resistance is within the range of values to provide oscillation to which the tank circuit is tuned.

A further advantage of the circuit is that it lends itself readily to external synchronization at the same frequency or a multiple of such frequency by means of a tap 46 on the inductance 8, this tap being connected via coupling capacitor 47 to input terminal 48 for connection of an external synchronization signal, which may be in the form of waves or pulses.

The following values and identification of components are suggested as one example of a specific preferred embodiment for generation of output frequencies of 19 kilocycles as fundamental and of 38 kilocycles as harmonic, but without intending to be limited thereto, all values being approximate.

| | |
|---|---|
| Unijunction transistor | 2N1671 (General Electric Co., U.S.A.). |
| Capacitor 16 | .004 microfarad. |
| Capacitors 9 and 10 | .0015 microfarad (each). |
| Capacitor 26 | .05 microfarad. |
| Capacitor 35 | .05 microfarad. |
| Capacitor 47 | 220 micromicrofarads. |
| Resistance (or potentiometer) 13 | 2000 ohms. (adjustable). |
| Resistance 14 | 2000 ohms. |
| Inductances 8 and 17 | 50 millihenries (each) (average—adjustable). |
| LC circuits 28 and 29 | Inductance of 50 millihenries (average—adjustable) and capacitance of 360 micromicrofarads, for each LC circuit. |

The direct current supply between terminals 1 and 2 may be from a 22.5 volt battery, for example.

Although a preferred form of the invention has been illustrated and described above and certain variations in the circuitry or values or components and the like have been mentioned, it will be obvious to those skilled in the art that other possible modifications in structural arrangement, components and values may be used in practice of the invention for particular environments or requirements without departing from the principles or spirit of the invention within the scope of the accompanying claims.

I claim:

1. An oscillator circuit comprising
a unijunction transistor having an emitter and a first base and a second base,
a positive direct current line and a return line,
a tank circuit in series with said bases and tuned to a desired output frequency, said tank circuit being connected between said positive line and said second base, and said first base being connected to said return line,
a second tank circuit similarly tuned and coupled to said first tank circuit and providing connections for the desired output,
a capacitor connected between said emitter and said first base,
and a resistance connected between positive line and said emitter,
said resistance and capacitor cooperating with said transistor to cause oscillation in said series base and tank circuit at said desired output frequency,
a third tank circuit tuned to a desired harmonic of said desired output frequency and coupled at one end to said return line, and a coupling capacitor coupling a said emitter to the other end of said third tank circuit,
a fourth tank circuit coupled to and tuned similarly to said third tank circuit and providing connections for an output of said desired harmonic frequency.

2. An oscillator as in claim 1 and in which the coupling of said first and second tank circuits is inductive.

3. An oscillator as in claim 1 and in which said resistance is variable for adjusting the output.

4. An oscillator as in claim 1 and in which said tank circuits each include a capacitor and an inductance in parallel and in which one of the two last named components is adjustable.

5. An oscillator as in claim 4 and further including
a coupling capacitor coupled to the said inductance of the said first tank circuit
for providing connection for external synchronization.

6. An oscillator circuit comprising
a unijunction transistor having an emitter and a first base and second base,
a positive direct current line and a return line relatively negative thereto,
a tank circuit in series with said bases between said positive and return lines and tuned for a desired frequency, means coupled to said tank circuit for providing an output frequency at said desired frequency.

and a resistance-capacitance circuit including a capacitor coupled between said emitter and first base, and a resistance coupling said capacitor to said positive direct current line for varying the conductivity of the transistor to provide periodic pulsations in said series base circuit at said desired frequency, another tank circuit coupled to said emitter-first base circuit and tuned to another frequency which is a harmonic of said desired frequency and means coupled to said another tank circuit for providing a second output frequency at said harmonic of said desired frequency.

7. An oscillator circuit as in claim 6 and including another capacitor for so coupling said other tank circuit in direct current blocking relation.

8. An oscillator circuit as in claim 6 and including an input tap and a capacitor coupled to circuit means coupling said first mentioned tank circuit for external synchronization of one of said frequencies.

9. An oscillator circuit as in claim 6 and in which said resistance is variable for adjustment of phase of said frequencies.

10. An oscillator as in claim 6 and in which said tank circuits are adjustably tuned.

References Cited in the file of this patent

UNITED STATES PATENTS

| | | |
|---|---|---|
| 2,502,673 | Rusk | Apr. 4, 1950 |
| 2,676,251 | Scarbrough | Apr. 20, 1954 |
| 2,863,056 | Pankove | Dec. 2, 1958 |
| 3,075,136 | Jones | Jan. 22, 1963 |